United States Patent

Yariv et al.

[11] Patent Number: 5,718,546
[45] Date of Patent: Feb. 17, 1998

[54] VIAL CAP AND TRANSDUCER GAUGE FOR WIRE BONDING CAPILLARIES

[75] Inventors: Yacov Yariv, Haifa, Israel; Eyal Mizrahi, Tokyo, Japan

[73] Assignee: Kulicke and Soffa Investments, Inc., Wilmington, Del.

[21] Appl. No.: 980,864

[22] Filed: Aug. 29, 1996

[51] Int. Cl.⁶ .................................................. A45C 11/26
[52] U.S. Cl. ........................ 206/349; 206/305; 206/379; 206/477
[58] Field of Search ........................ 206/305, 306, 206/349, 372, 373, 376, 377, 379, 381, 477; 211/69, 70.6

[56] References Cited

U.S. PATENT DOCUMENTS

| | | | |
|---|---|---|---|
| 3,283,894 | 11/1966 | Hafner et al. | 206/306 |
| 3,803,915 | 4/1974 | Chaney | 206/306 |
| 4,445,611 | 5/1984 | Shofu | 206/379 |
| 4,867,305 | 9/1989 | Schneider | 206/379 |

*Primary Examiner*—David T. Fidei
*Attorney, Agent, or Firm*—John B. Sowell

[57] ABSTRACT

A novel container is provided for holding fragile wire bonding capillaries which comprises two parts, one being a resilient cap and the other being a cover which allows the capillary to be transported therein. The resilient cap comprises a first outer connector on the base for receiving a cover and comprises a second inner connector for receiving a capillary therein. The inner connector is further provided with a gage surface for mounting the capillary in a transducer at a proper working height without removing the capillary from the container cap. Further, the novel cap is provided with vertical slots in the inner and the outer connectors which permits the cap to be moved horizontally to remove the capillary from the cap without harming the fragile tip of the capillary.

10 Claims, 6 Drawing Sheets

5,718,546

VIAL CAP AND TRANSDUCER GAUGE FOR WIRE BONDING CAPILLARIES

BACKGROUND OF THE INVENTION

1. Field of the Invention

The present invention relates to containers for holding fragile wire bonding capillaries and more particularly to a novel vial cap/vial gage incorporated into the cap of a container.

2. Description of the Prior Art

Capillary bonding tools were originally made of glass and were very brittle. Handling such tools usually included wrapping or packaging in soft packaging materials to avoid damage. Later, capillary bonding tools were manufactured from metal or sintered carbides and were very hard and durable for handling, thus packaging did not require soft packaging materials even though the use of such packaging material was continued. Wedge bonding capillaries are still made from metal and/or sintered carbides and are hard and very durable. However, most wire bonding capillaries for ball bonding are now made from ceramic powder. The particles of ceramic powder used are less than two microns in size and average less than one micron in size. The ceramic powder is compressed and processed to produce finished ceramic blanks that are non porous, very brittle and have a Vickers hardness of about 2000.

Such ceramic capillaries are made for bonding wires on fine pitch bonding pads. It is not unusual to have a wall thickness at the tip less than fifty microns (approximately 0.002 inches). Special containers have been made to prevent damage of tools of this type when they are shipped, however, the tools are so fragile that they are often broken in the attempt to remove the tool from the container or in an attempt to clamp the bonding tool into an ultrasonic transducer at the proper height using a bonding tool gauge.

It would be desirable to eliminate the above handling steps during which fragile bonding tools are most likely to be broken.

SUMMARY OF THE INVENTION

It is a principal object of the present invention to provide a novel container for directly mounting a capillary in a transducer from the container without the necessity for intermediate handling steps.

It is a principal object of the present invention to provide a novel container for protecting fragile capillaries during packaging and unpackaging.

It is a another principal object of the present invention to provide a novel cap on a container or vial which comprises a transducer gauge.

It is a another object of the present invention to provide a novel vial cap and combine transducer gauge with an auxiliary handle.

It is yet another object of the present invention to provide a novel vial cap which releasably holds a fragile capillary.

According to these and other objects of the present invention there is provided a resilient cap having a base for receiving a handle. An outer cylindrical shaped connector portion is mounted on the base and adapted to receive a tube or vial which covers the capillary. An inner U-shaped connector portion is mounted on the base and adapted to receive a capillary with the mounting end exposed above the U-shaped connector portion for mounting in a transducer. Both connector portions on the base of the cap are provided with vertical slots which permit the capillary to be removed horizontally from the cap once the capillary is inserted into the transducer at the proper gage height.

DESCRIPTION OF A PREFERRED EMBODIMENT

Figure 1:
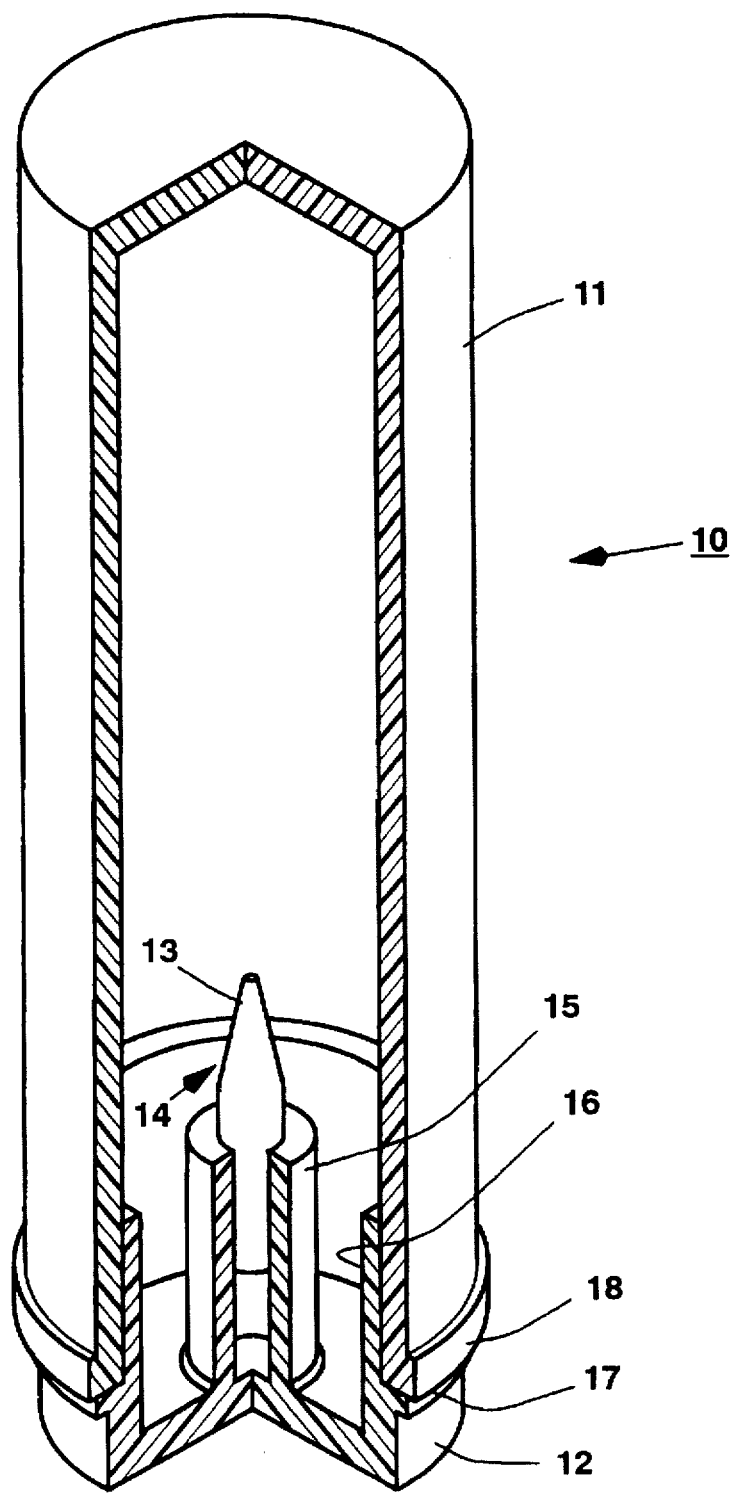
FIG. 1 is an enlarge front view and partial section of a prior art plastic vial and cap.

Refer now to FIG. 1 showing a prior art container 10 comprising a vial cover or tube 11 and a base or cap 12. The base 12 is adapted to receive a capillary 14 having its fragile capillary tip 13 extended upward when mounted in the recess in the inner connector 15. The outer connector 16 of the cap 12 is provided with a flange 17 to limit the extent that the cap 12 can move onto the vial cover. It is intended that the capillary 14 be removed from its inner connector 15 by tweezers of some other clamping means and placed in a gaging fixture.

Figure 2:
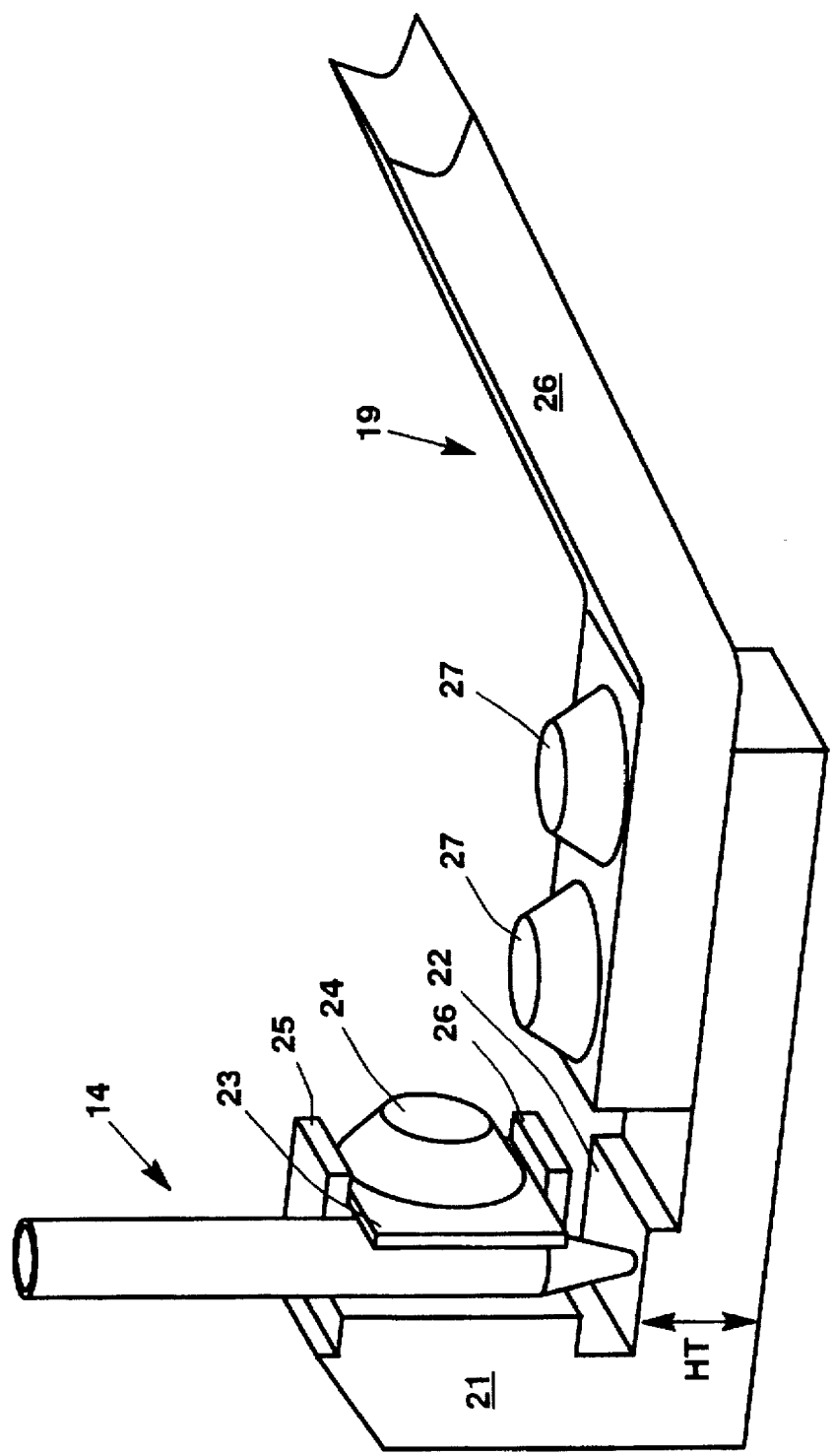
FIG. 2 is an enlarged perspective view of a prior art gage and capillary holding fixture.

Refer now to FIG. 2 showing a prior art gage holding fixture 21 in which the capillary 14 has been placed after being removed from the cap 12. The holding fixture 19 comprises a gage block 21 having a gage surface 22 at a height $H_T$ from its bottom surface. A spring 23 is mounted on the gage block by a screw 24 which positions the spring 23 between a pair of spring guides 25 as part of the gage block 21. The holding fixture 21 includes a handle 26 held by a pair of screws 27. In the preferred embodiment of the present invention the capillary 14 is snapped into the position shown against the bias of spring 23 and after being inserted into a transducer is capable of being released from the spring pressure.

Figure 3:
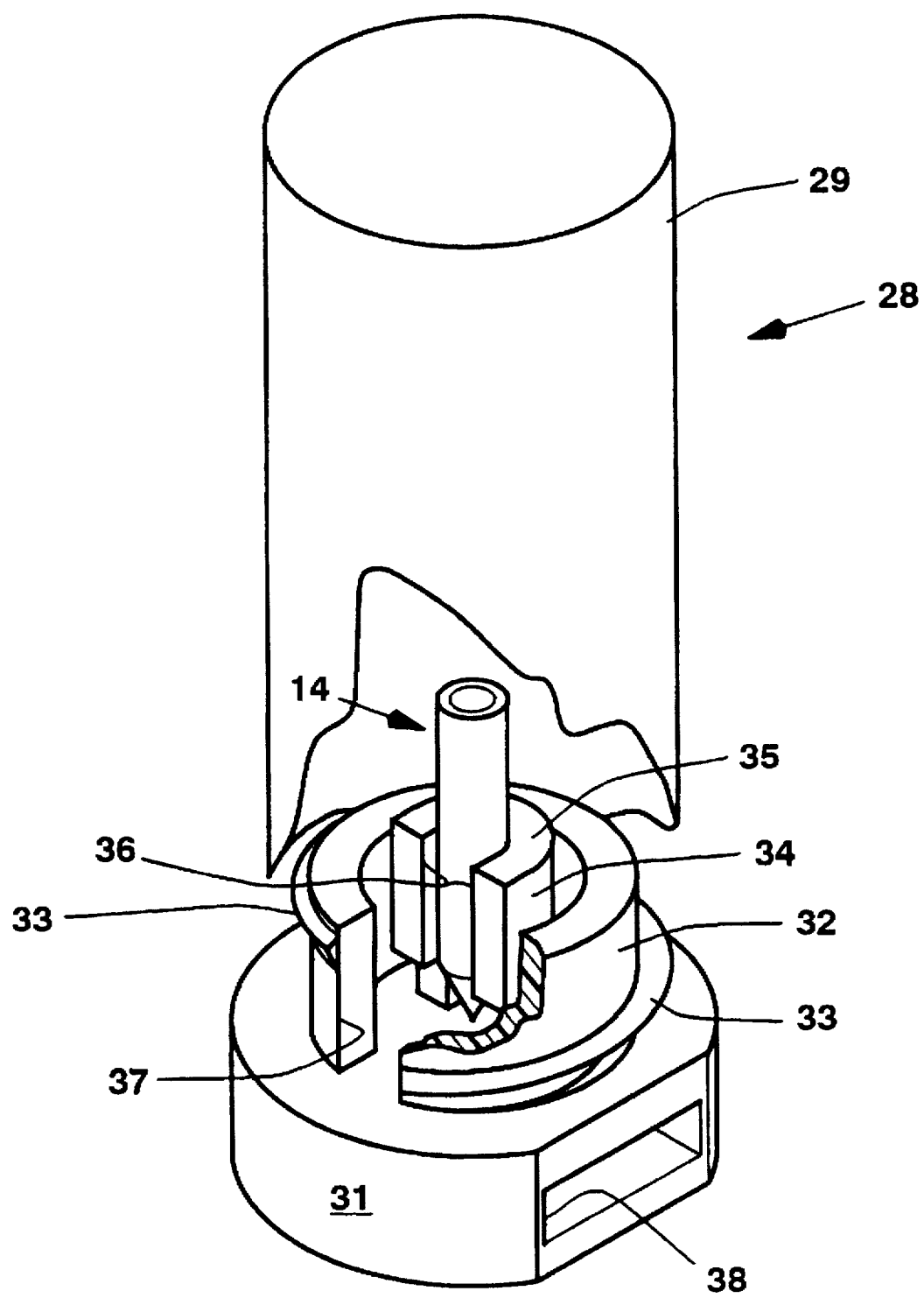
FIG. 3 is an enlarged perspective view in partial section of the present invention combined vial cap/vial gage and vial showing an auxiliary recess adapter.

Refer now to FIG. 3 showing an enlarged perspective view and partial section of the present invention which comprises a combined vial cap and vial gage and shows an auxiliary handle recess adapter in the vial cap. The combination container and gage 28 comprises a vial cover 29 and a base 31. The base 31 has a outer connector 32 with self locking screw means 33 and a U-shaped inner connector 34 which provides a top gage surface 35 for gaging the height of the transducer. It will be understood that the capillary 14 is to be inserted into a transducer which rest on the top surface 35 and the capillary 14 is clamped therein and the cap 31 is moved horizontally sideways. The slots 36 and 37 allow the capillary to be removed from the cap 31 under the transducer. Further, there is provided an aperture 38 for receiving a handle therein. The aperture 38 is shown as a rectangular recess for receiving a handle which snaps into place.

Figure 4:
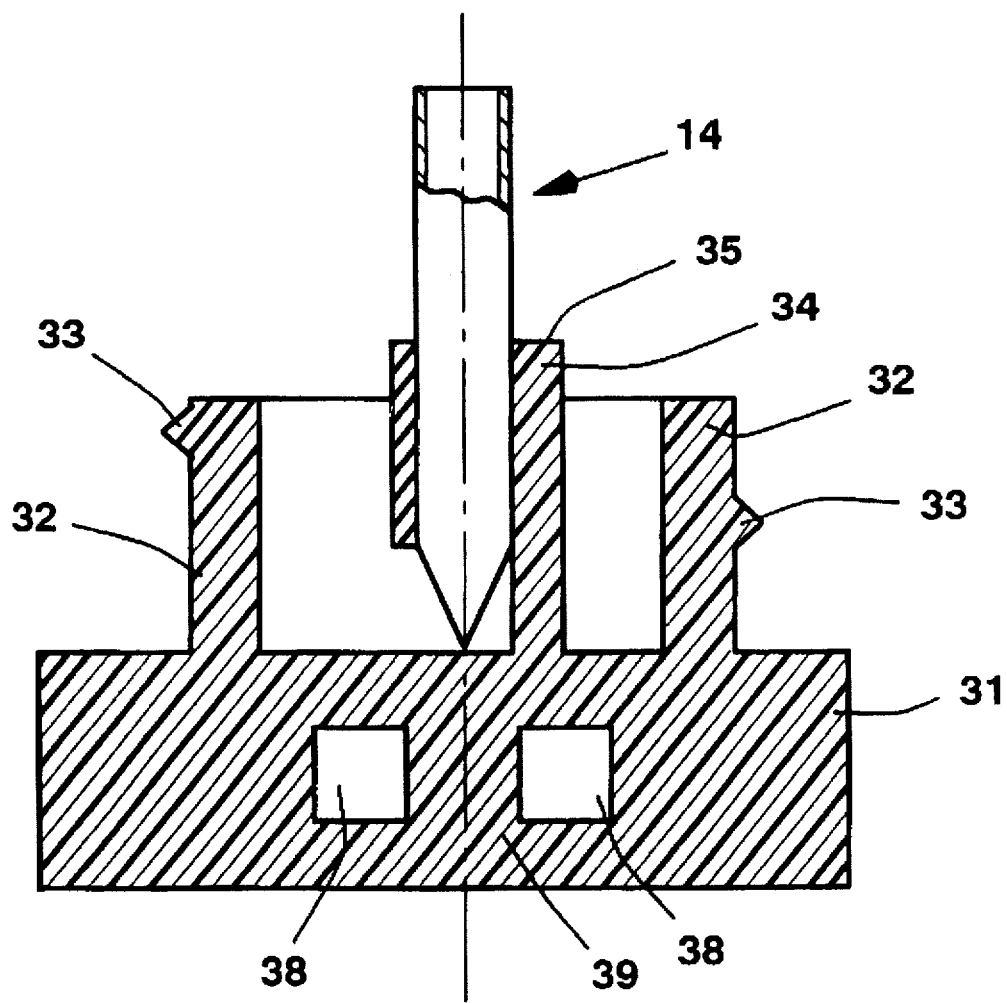
FIG. 4 is an enlarged side view in section of the vial cap of FIG. 3 showing the holding pin which snaps onto the auxiliary handle.

Refer now to FIG. 4 showing an enlarged side view in section of the novel vial cap 31 also showing the holding pin which snaps onto the auxiliary handle. The cap 31 is shown holding a capillary 14 in the U-shaped inner connector 34. The outer connector 32 is shown having self-locking screw means 33 as an integral part of the cap 31. A pair of apertures 38 in the cap 31 are adapted to form a snap connector pin 39 for the handle which will be explained hereinafter.

Figure 5:
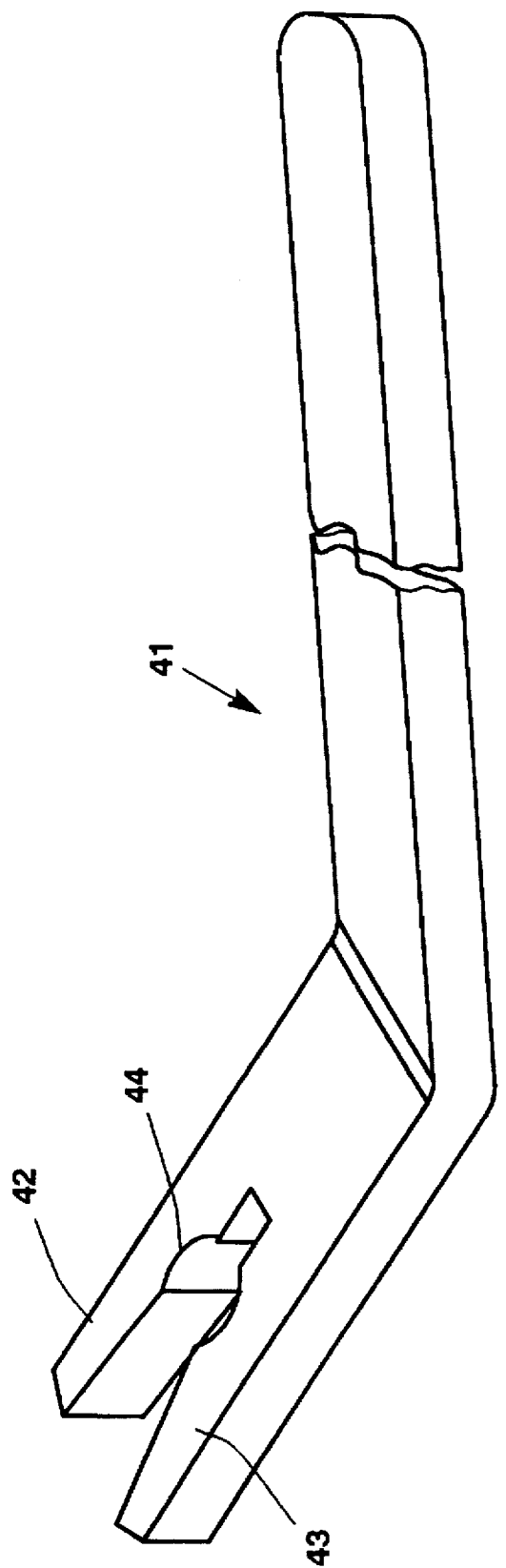
FIG. 5 is a perspective view of a preferred embodiment auxiliary handle for clamping onto the vial cap/vial gage shown in FIGS. 3 and 4.

Refer now to FIG. 5 showing a handle 41 for connection into aperture 38 and on pin 39. Handle 41 has a pair of bifurcated fingers 42 and 43 which are adapted to fit into the recess 38 and snap onto the connector pin 39 at the complementary recess 44.

It will be understood that a pin or connector 39 could be placed at the outside of the recess 38.

Figure 6:
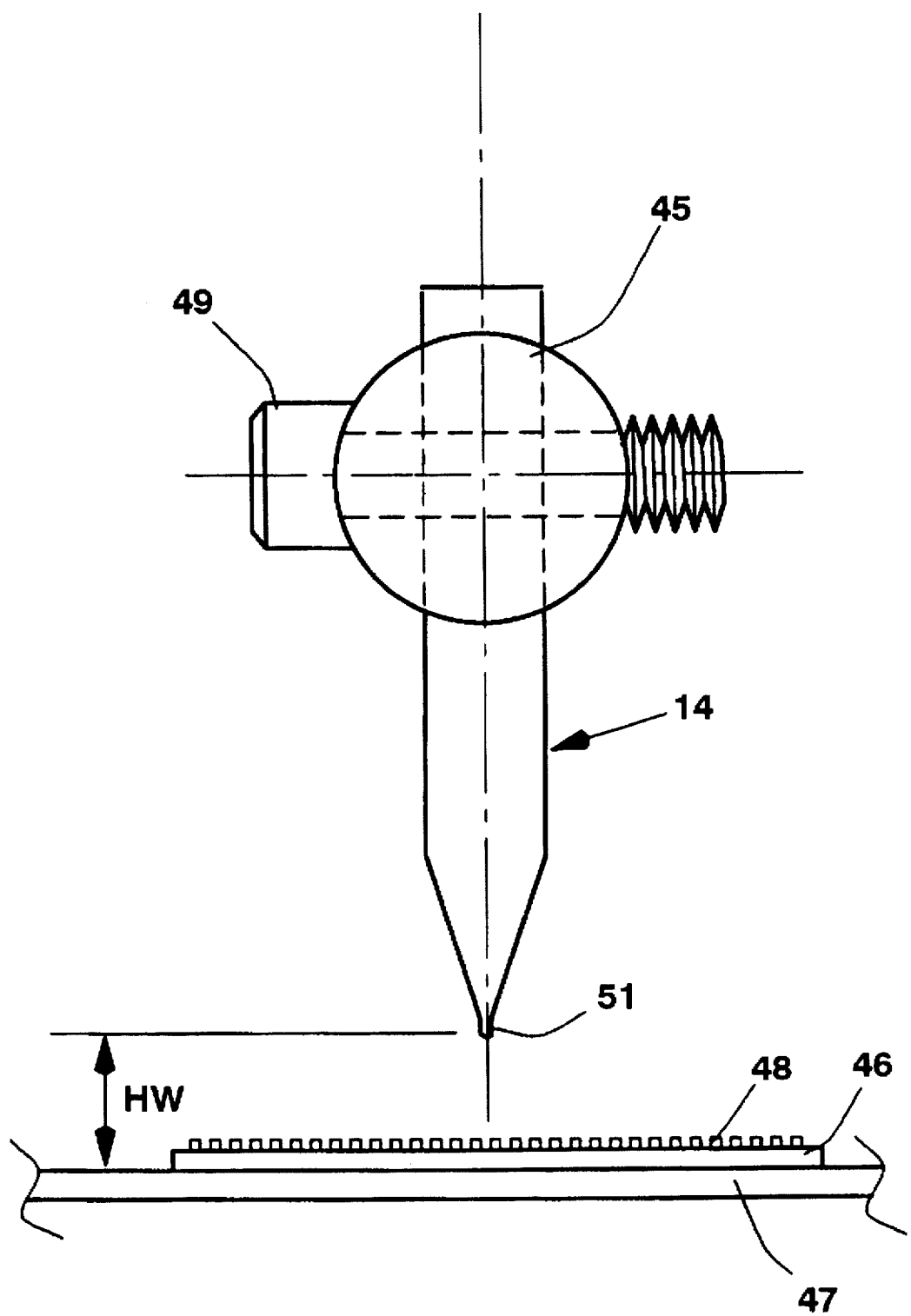
FIG. 6 is a front view of a ceramic wire bonding capillary clamped in a transducer horn at a proper gage height over a semiconductor device.

Refer now to FIG. 6 showing a front view of a ceramic wire bonding capillary 14 clamped in a transducer horn 45 at a proper working height. The semiconductor 46 is shown mounted on a part of a work station 47 and provided with bonding pads 48 which are wire bonded to form wire inner connections between the pads 48 and leads on a lead frame or a target on a carrier.

Having explained a preferred embodiment of the present invention, it will now be appreciated that the capillary 14 remains in the cap 31 of the vial 28 and does not have to be removed from the cap 31 until after it is installed and clamped by the screw 49 in the transducer 45. In this manner, it is possible to assure that the fragile, thin wall bottle nose tip 51 is not damaged during installation prior to use. Further, it will be appreciated that the novel combination cap and gage will assure that the capillary 14 is installed at the proper working height $H_W$ without having to be touched by tweezers or any clamping and holding means which could very easily crush the thin wall capillary 14 or even break the tip 51 during installation or removal from the cap 31.

What is claimed is:

1. A container for holding fragile capillaries, comprising:
   a resilient cap,
   a first outer connector on said cap for receiving a tube or vial,
   a second inner connector on said cap for receiving a capillary therein,
   said outer and inner connectors on said cap having vertical slots therein to permit horizontal removal of said capillary from said cap, and
   said inner connector extending above said outer connector to provide a gage for the insertion of said capillary in a transducer to a proper working height $H_T$.

2. A container as set forth in claim 1 wherein said outer connector is cylindrical in shape and said inner connector is U-shaped.

3. A container as set forth in claim 1 wherein said base as provided with an aperture for receiving a handle therein.

4. A container as set forth in claim 3 wherein said aperture in said base is rectangular in shape for receiving a rectangular handle therein.

5. A container as set forth in claim 3 wherein said base is further provided with a handle connector in said aperture for receiving said handle.

6. A container as set forth in claim 5 wherein said handle connector comprises a cylindrical shape for cooperating with a complementary shape on said handle.

7. A container as set forth in claim 6 wherein said handle connector comprises a cylindrical snap pin for cooperating with a pair of bifurcated fingers or arms on said handle.

8. A container as set forth in claim 3 wherein said aperture in said base and said handle are rectangular in shape.

9. A container as set forth in claim 1 wherein said cap further comprises locking means for receiving a vial cover thereon.

10. A container as set forth in claim 9 wherein said vial cover and said cap are provided with self locking screw means.

* * * * *